US012796481B2

(12) United States Patent
Yang

(10) Patent No.: US 12,796,481 B2
(45) Date of Patent: Nov. 10, 2026

(54) METHOD FOR AUTOMATICALLY GENERATING CHIP IDENTIFIERS FOR SEMICONDUCTOR DIES IN STACKED STRUCTURE, SEMICONDUCTOR DEVICE, AND MEMORY DEVICE USING THE SAME

(71) Applicant: NANYA TECHNOLOGY CORPORATION, New Taipei City (TW)

(72) Inventor: Wu-Der Yang, New Taipei City (TW)

(73) Assignee: NANYA TECHNOLOGY CORPORATION, New Taipei City (TW)

(*) Notice: Subject to any disclaimer, the term of this patent is extended or adjusted under 35 U.S.C. 154(b) by 373 days.

(21) Appl. No.: 18/630,200

(22) Filed: Apr. 9, 2024

(65) Prior Publication Data

US 2025/0316608 A1 Oct. 9, 2025

(51) Int. Cl.
*H10W 46/00* (2026.01)
*H10P 72/00* (2026.01)
*H10W 90/00* (2026.01)

(52) U.S. Cl.
CPC ......... *H10W 46/00* (2026.01); *H10P 72/0614* (2026.01); *H10W 90/00* (2026.01);
(Continued)

(58) Field of Classification Search
CPC ... H10W 46/00; H10W 90/00; H10W 90/701; H10W 90/722; H10W 90/724;
(Continued)

(56) References Cited

U.S. PATENT DOCUMENTS 8,778,734 B2 7/2014 Metsis
9,245,871 B2 1/2016 Suh
(Continued)

FOREIGN PATENT DOCUMENTS

TW 202322132 A 6/2023

OTHER PUBLICATIONS

Office Action and and the search report mailed on Feb. 7, 2025 related to Taiwanese Application No. 113119691.
(Continued)

*Primary Examiner* — Evan G Clinton
(74) *Attorney, Agent, or Firm* — Xuan Zhang

(57) ABSTRACT

A method for automatically generating chip identifier for semiconductor dies in a stacked structure is provided. The method includes the following steps: obtaining a first semiconductor die and a second semiconductor die, wherein the first semiconductor die and the second semiconductor die include a first identifier generation circuit and a second identifier generation circuit, respectively; forming a stacked structure by stacking the second semiconductor die on the first semiconductor die, wherein the first identifier generation circuit is electrically connected to the second identifier generation circuit; and generating a first chip identifier and a second chip identifier for the first semiconductor die and the second semiconductor die by the first identifier generation circuit and the second identifier generation circuit, respectively. The second chip identifier is a bit-shifted value of the first chip identifier.

16 Claims, 9 Drawing Sheets

(52) U.S. Cl.
CPC ........ *H10W 90/701* (2026.01); *H10W 90/722* (2026.01); *H10W 90/724* (2026.01)

(58) Field of Classification Search
CPC .. H10W 46/401; H10P 72/0614; H10B 80/00; H10B 12/50
See application file for complete search history.

(56) References Cited

U.S. PATENT DOCUMENTS

| | | | | |
|---|---|---|---|---|
| 2012/0025391 | A1* | 2/2012 | Imai ....................... | G11C 16/20 257/773 |
| 2013/0280863 | A1 | 10/2013 | Suh | |
| 2014/0368319 | A1* | 12/2014 | Kato .................. | G06K 7/10366 257/774 |
| 2017/0110159 | A1* | 4/2017 | Hamada ................... | G11C 5/02 |
| 2022/0406368 | A1 | 12/2022 | Jung et al. | |
| 2023/0023957 | A1 | 1/2023 | Macfaden et al. | |
| 2023/0072674 | A1 | 3/2023 | Vogelsang et al. | |

OTHER PUBLICATIONS

Office Action and and the search report mailed on Apr. 25, 2025 related to Taiwanese Application No. 114106240.

* cited by examiner

300

500

METHOD FOR AUTOMATICALLY GENERATING CHIP IDENTIFIERS FOR SEMICONDUCTOR DIES IN STACKED STRUCTURE, SEMICONDUCTOR DEVICE, AND MEMORY DEVICE USING THE SAME

TECHNICAL FIELD

The present disclosure relates to electronic circuits, and more particularly, to a method for automatically generating chip identifiers for semiconductor dies in a stacked structure, a semiconductor device, and a memory device using the same.

DISCUSSION OF THE BACKGROUND

With the development of technology, memory devices can now have a much larger storage capacity by using a three-dimensional memory stack. Additionally, it is important for each memory chip within the stack to have a unique identifier. However, when manufacturing the memory stack, conflicts can occur if the chip identifiers are set before stacking, causing issues with different memory chips having the same identifier. Accordingly, there is a demand for a method for automatically generating chip identifiers for semiconductor dies in a stacked structure, a semiconductor device, and a memory device using the same to solve the aforementioned problem.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a semiconductor device, which includes a plurality of semiconductor dies arranged in a stacked structure. Each semiconductor die includes an identifier generation circuit electrically connected to the identifier generation circuits of other semiconductor dies. In response to a first semiconductor die not being a bottom semiconductor die within the stacked structure, a first identifier generation circuit of the first semiconductor die is configured to automatically generate a first chip identifier for the first semiconductor die based on an input signal generated by a second identifier generation circuit of a second semiconductor die neighboring to and below the first semiconductor die.

Another aspect of the present disclosure provides a method for automatically generating chip identifier for semiconductor dies in a stacked structure. The method includes the following steps: obtaining a first semiconductor die and a second semiconductor die, wherein the first semiconductor die and the second semiconductor die comprise a first identifier generation circuit and a second identifier generation circuit, respectively; forming a stacked structure by stacking the second semiconductor die on the first semiconductor die, wherein the first identifier generation circuit is electrically connected to the second identifier generation circuit; and generating a first chip identifier and a second chip identifier for the first semiconductor die and the second semiconductor die by the first identifier generation circuit and the second identifier generation circuit, respectively, wherein the second chip identifier is a bit-shifted value of the first chip identifier.

Yet another aspect of the present disclosure provides a memory device, which includes a stacked structure having a first memory die and a second memory die. The first memory die is stacked on the second memory die. The first memory die and the second memory die include a first identifier generation circuit and a second identifier generation circuit, respectively. The second identifier generation circuit is configured to automatically generate a second chip identifier for the second memory die using a preset value. The first identifier generation circuit is configured to automatically generate a first chip identifier using the second chip identifier.

The foregoing outlines rather broadly the features and technical advantages of the present disclosure so that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

Figure 1:
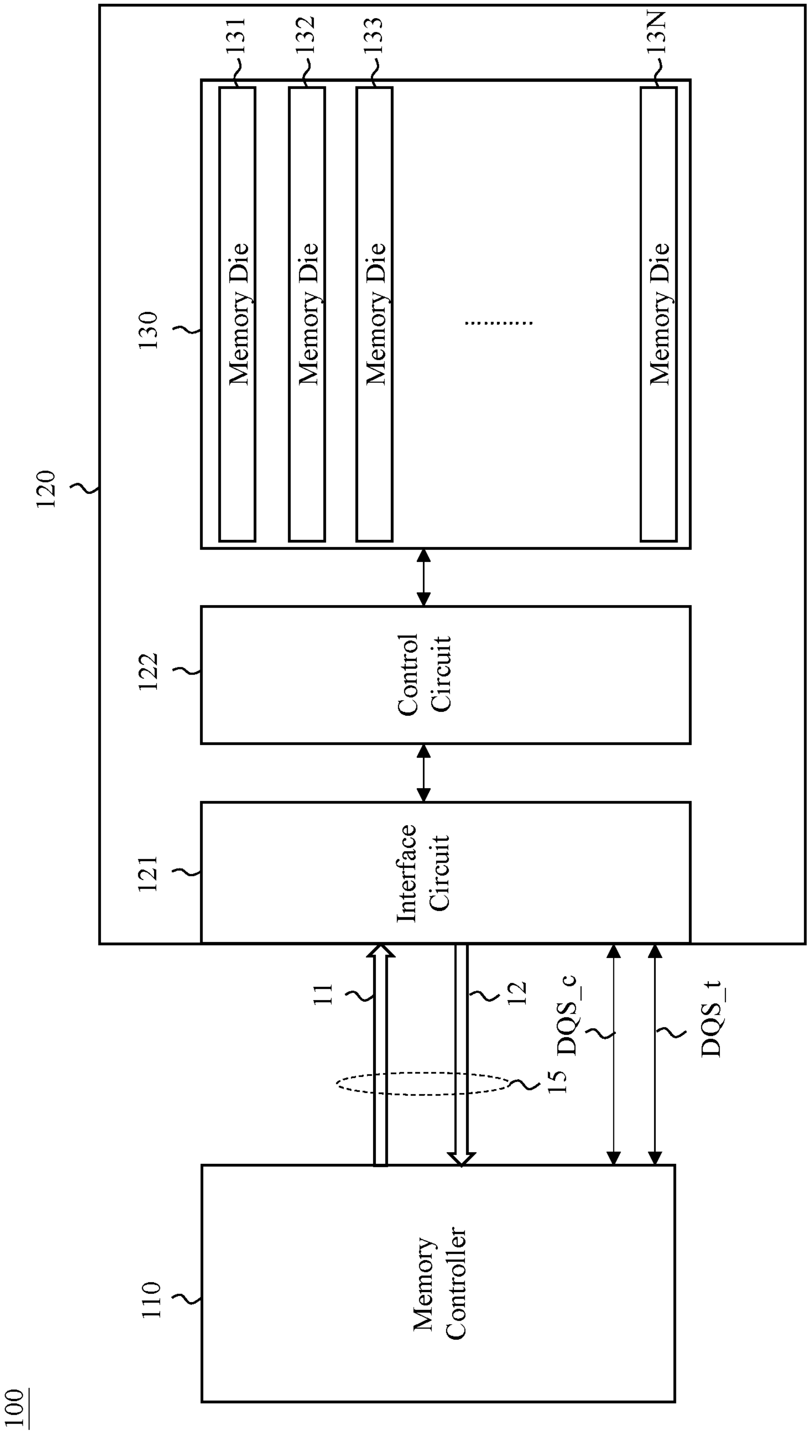
FIG. 1 is a block diagram of an electronic device 100 in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (for example, rotated 90° or at other orientations) and the spatially relative descriptors used herein interpreted accordingly. In addition, it will also be understood that when a layer is referred to as being "between" two layers, it can be the only layer between the two layers, or one or more intervening layers may also be present.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

It will be understood that when an element or layer is referred to as being "formed on," another element or layer, it can be directly or indirectly formed on the other element or layer. That is, for example, intervening elements or layers may be present. In contrast, when an element or layer is referred to as being "directly formed on," another element, there are no intervening elements or layers present. Other words used to describe the relationship between elements or layers should be interpreted in a like fashion (e.g., "between," versus "directly between," "adjacent," versus "directly adjacent," etc.).

FIG. 1 is a block diagram of an electronic device 100 in accordance with some embodiments of the present disclosure.

In some embodiments, the electronic device 100 may include a memory controller 110 and a memory device 120, as depicted in FIG. 1. The memory controller 110 may be implemented by a central processing unit (CPU), a microprocessor, a digital signal processor, a field-programmable gate arrays (FPGA), an application-specific integrated circuit (ASIC), or a radio-frequency integrated circuit (RFIC).

In some embodiments, the memory device 120 may be a dynamic random access memory (DRAM). In other embodiments, other types of memories can be used. For purposes of description, this disclosure may focus on double-date rate synchronous dynamic random access memory (DDR SDRAM) such as DDR5, but the scope of embodiments is not limited to any particular memory technology or standard.

In some embodiments, the memory device 120 may include an interface circuit 121, a control circuit 122, and a stacked structure 130, as depicted in FIG. 1. The interface circuit 121 may be configured to transmit and receive data signals 12 over bus 15, and to receive command control signals and address signals 11 and data strobe signals DQS_c and DQS_t from the memory controller 110 over bus 15. In other words, the interface circuit 121 may include TXm circuits (not explicitly shown) for the data signals 12, and RX circuits (not explicitly shown) for the command control signals and address signals 11, data signals 12, and data strobe signals DQS_c and DQS_t.

The stacked structure 130 may be a three-dimensional (3D) stacked memory architecture that includes a plurality of memory dies 131 to 13N. The memory dies 131 to 13N can be vertically stacked using through-silicon vias (TSVs) and microbump (μbump) interconnects, the details of which will be described later.

In some embodiments, the data strobe signal DQS_c may be a complementary signal of the data strobe signal DQS_t. For example, when the data strobe signal DQS_t is in the high logic state (e.g., 1), the data strobe signal DQS_c is in the low logic state (e.g., 0). When the data strobe signal DQS_t is in the low logic state (e.g., 0), the data strobe signal DQS_c is in the high logic state (e.g., 1).

In some embodiments, the control circuit 122 may perform a read operation or a write operation according to the command control signals 11 and the data strobe signals DQS_c and DQS_t. For example, during a write operation, the memory device 120 may receive a write command (e.g., including command control signal 11 and data signals 12) from the memory controller 110 over bus 15, and the control circuit 122 may then store the received data in the stacked structure 130. During a read operation, the memory device 120 may receive a read command signal (e.g., command control signal 11) from the memory controller 110 over bus 15, and the control circuit 122 may then access the data from various memory cells of the stacked structure 130, and transmit those bits of data (e.g., data signals 12) to the memory controller 110 over bus 15.

Figure 2:
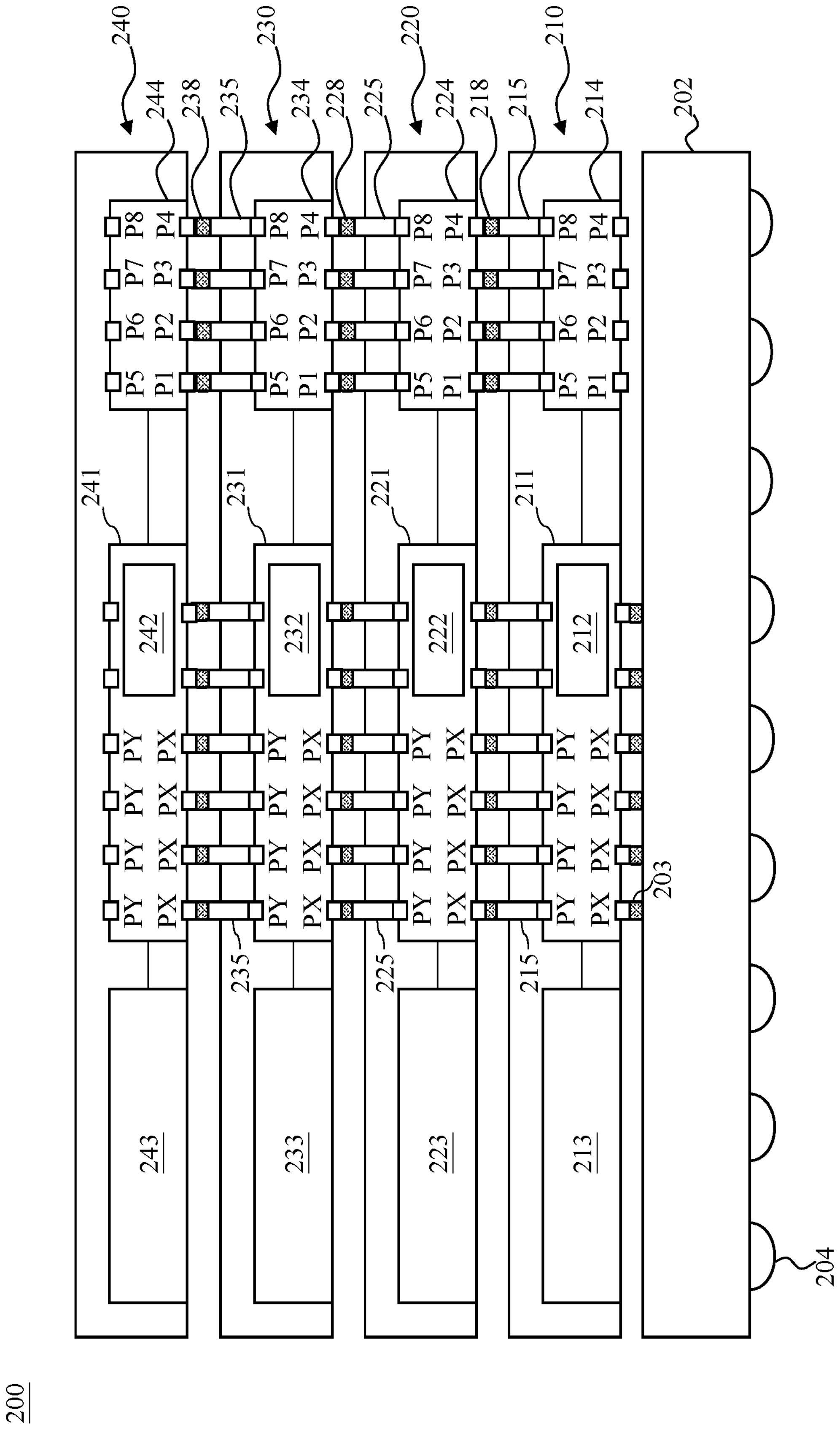
FIG. 2 is a diagram of a stacked structure in accordance with some embodiments of the present disclosure.

FIG. 2 is a diagram of a stacked structure in accordance with some embodiments of the present disclosure. Please refer to FIG. 1 and FIG. 2.

In some embodiments, the stacked structure 130 shown in FIG. 1 can be implemented using the stacked structure 200 shown in FIG. 2. For purposes of description, four semiconductor dies 210, 220, 230, and 240 are shown in FIG. 2. In some embodiments, the semiconductor dies 210, 220, 230, and 240 may correspond to the memory dies 131, 132, 133, and 134 in FIG. 1, respectively. The semiconductor die 210 may include logic circuitry 211, a memory cell array 213, and an identifier generation circuit 214. Similarly, the semiconductor die 220 may include logic circuitry 221, a memory cell array 223, and an identifier generation circuit 224, the semiconductor die 230 may include logic circuitry 231, a memory cell array 233, and an identifier generation circuit 234, and semiconductor die 240 may include logic circuitry 241, a memory cell array 243, and an identifier generation circuit 244.

In some embodiments, the semiconductor die 210 may include microbumps PX and PY formed on opposite sides of the logic circuitry 211, and microbumps P1 to P4 and P5 to P8 formed on opposite sides of the identifier generation circuit 214. For example, the microbumps PX and P1 to P4 may be formed on the front side of the semiconductor die 210. The semiconductor die 210 may be electrically connected to a package substrate 202 through the solder balls 203 and microbumps PX on the logic circuitry 211. Additionally, the package substrate 202 may be electrically connected to the memory controller 110 through the bumps 204 (e.g., copper bumps). It should be noted that the semiconductor die 210 may include a plurality of through-silicon vias (TSV) 215, and each TSV 215 may correspond to one of the microbumps PY on the logic circuitry 211 and microbumps P5 to P8 on the identifier generation circuit 214.

Similarly, the semiconductor die 220 may include microbumps PX and PY formed on opposite sides of the logic circuitry 221, and microbumps P1 to P4 and P5 to P8 formed on opposite sides of the identifier generation circuit 224. For example, the microbumps PX and P1 to P4 may be formed on the front side of the semiconductor die 220. The semiconductor die 220 may be electrically connected to the semiconductor die 210 through the microbumps PX formed on the logic circuitry 221, the solder balls 218, TSVs 215, and microbumps PY and P5 to P8 of the semiconductor die 210, as depicted in FIG. 2. It should be noted that the semiconductor die 220 may include a plurality of through-silicon vias (TSV) 225, and each TSV 225 may correspond to one of the microbumps PY on the logic circuitry 221 and microbumps P5 to P8 on the identifier generation circuit 224.

Similarly, the semiconductor die 230 may include microbumps PX and PY formed on opposite sides of the logic circuitry 231, and microbumps P1 to P4 and P5 to P8 formed on opposite sides of the identifier generation circuit 234. For example, the microbumps PX and P1 to P4 may be formed on the front side of the semiconductor die 230. The semiconductor die 230 may be electrically connected to the semiconductor die 220 through the microbumps PX formed on the logic circuitry 231, the solder balls 228, TSVs 225, and microbumps PY and P5 to P8 of the semiconductor die 220, as depicted in FIG. 2.

Similarly, the semiconductor die 240 may include microbumps PX and PY formed on opposite sides of the logic circuitry 241, and microbumps P1 to P4 and P5 to P8 formed on opposite sides of the identifier generation circuit 244. For example, the microbumps PX and P1 to P4 may be formed on the front side of the semiconductor die 240. The semiconductor die 240 may be electrically connected to the semiconductor die 230 through the microbumps PX formed on the logic circuitry 241, the solder balls 238, TSVs 235, and microbumps PY and P5 to P8 of the semiconductor die 230, as depicted in FIG. 2.

In some embodiments, the logic circuitry 211, 221, 231, and 241 may be or include memory control logic for controlling data accessing of the memory cell array 213, 223, 233, 243, respectively. Additionally, the logic circuitry 211, 221, 231, and 241 may include decoder circuits 212, 222, 232, and 242 configured to coordinate the chip identifiers received from the identifier generation circuits 214, 224, 234, and 244 on the semiconductor dies 210, 220, 230, and 240, allowing the memory controller 110 to access, the command control signals and address signals 11, one of the memory cell arrays 213, 223, 233, and 243 disposed on the semiconductor dies 210, 220, 230, and 240, respectively.

In some embodiments, the memory cell arrays 213, 223, 233, and 243 on the semiconductor dies 210, 220, 230, and 240 may form a memory space. Each of the memory cell arrays 213, 223, 233, and 243 may be a portion of the memory space which corresponds to one or more most significant bits (MSB) of the address signal from the memory controller 110. In some embodiments, the memory controller 110 may access the memory cell arrays 213, 223, 233, and 243 disposed on the semiconductor dies 210, 220, 230, and 240 by setting the two most significant bits to 2'b00, 2'b01, 2'b10, and 2'b11, respectively.

For example, the decoder circuit 212 may receive the chip identifier of the semiconductor die 210 generated by the identifier generation circuit 214, and then transmit the received chip identifier to the decoder circuits 222, 232, and 242 disposed on other semiconductor dies, such as semiconductor dies 220, 230, and 240. Similarly, the decoder circuits 222, 232, and 242 may receive the chip identifier generated by the respective identifier generation circuits 224, 234, and 244 disposed their respective semiconductor dies 220, 230, and 240, and then transmit the received chip identifier to the decoders disposed on other semiconductor dies.

More specifically, the identifier generation circuits 214, 224, 234, and 244, which have the same circuit design, are electrically connected in series. Each of the identifier generation circuits 214, 224, 234, and 244 may generate a unique chip identifier (or die identifier) of the semiconductor die on which the respective one of identifier generation circuits 214, 224, 234, and 244 is disposed. Additionally, the chip identifier generated by each of the identifier generation circuits 214, 224, 234, and 244 may be based on the input signal of each identifier generation circuits 214, 224, 234, and 244.

In some embodiments, the semiconductor die 210 is the bottom semiconductor die or the first die among the stacked structure 200, and the identifier generation circuit 214 may generate a 4-bit unique chip identifier (or die identifier) such as "0001" that represents the bottom die or the first die among the stacked structure 200. It should be noted that the microbumps P1 to P4 disposed on the identifier generation circuit 214 of the semiconductor die 210 may be floating, and the identifier generation circuit 214 may automatically generate the 4-bit chip identifier as 0001. Here, the 4-bit chip identifier is encoded in a "one-hot" code for purposes of description, and other encoding methods can be used as well.

In some embodiments, the semiconductor die 220 is the second die among the stacked structure 200, and the identifier generation circuit 224 may generate a 4-bit unique chip identifier (or die identifier) such as "0010" that represents the second die among the stacked structure 200. For example, the chip identifier (e.g., "0001") generated by the identifier generation circuit 214 may be used as the input signal of the identifier generation circuit 224, and the identifier generation circuit 224 may left shift (e.g., circular left shift) the input signal (e.g., "0001") by 1 bit to obtain the output chip identifier (e.g., "0010") for the semiconductor die 220.

In some embodiments, the semiconductor die 230 is the third die among the stacked structure 200, and the identifier generation circuit 234 may generate a 4-bit unique chip identifier (or die identifier) such as "0100" that represents the third die among the stacked structure 200. For example, the chip identifier (e.g., "0010") generated by the identifier generation circuit 224 may be used as the input signal of the identifier generation circuit 234, and the identifier generation circuit 234 may left shift (e.g., circular left shift) the input signal (e.g., "0010") by 1 bit to obtain the output chip identifier (e.g., "0100") for the semiconductor die 230.

In some embodiments, the semiconductor die 240 is the fourth die or the topmost die among the stacked structure 200, and the identifier generation circuit 244 may generate a 4-bit unique chip identifier (or die identifier) such as "1000" that represents the fourth die among the stacked structure 200. For example, the chip identifier (e.g., "0100") generated by the identifier generation circuit 234 may be used as the input signal of the identifier generation circuit 244, and the identifier generation circuit 244 may left shift (e.g., circular left shift) the input signal (e.g., "0100") by 1 bit to obtain the output chip identifier (e.g., "1000") for the semiconductor die 240.

It should be noted that the semiconductor dies 210, 220, 230, and 240 may have substantially the same circuit design. No matter whether the order of the semiconductor dies 210, 220, 230, and 240 within the stacked structure 200 is changed, the identifier generation circuits 214, 224, 234, and 244 are still capable of generating correct and unique chip identifiers for the semiconductor dies 210, 220, 230, and 240 with respect to their locations within the stacked structure 200. Furthermore, in some embodiments, identifier generation circuits 214, 224, 234, and 244 can also perform right shift (e.g., circular right shift) on their input signals with appropriate arrangements.

Figure 3:
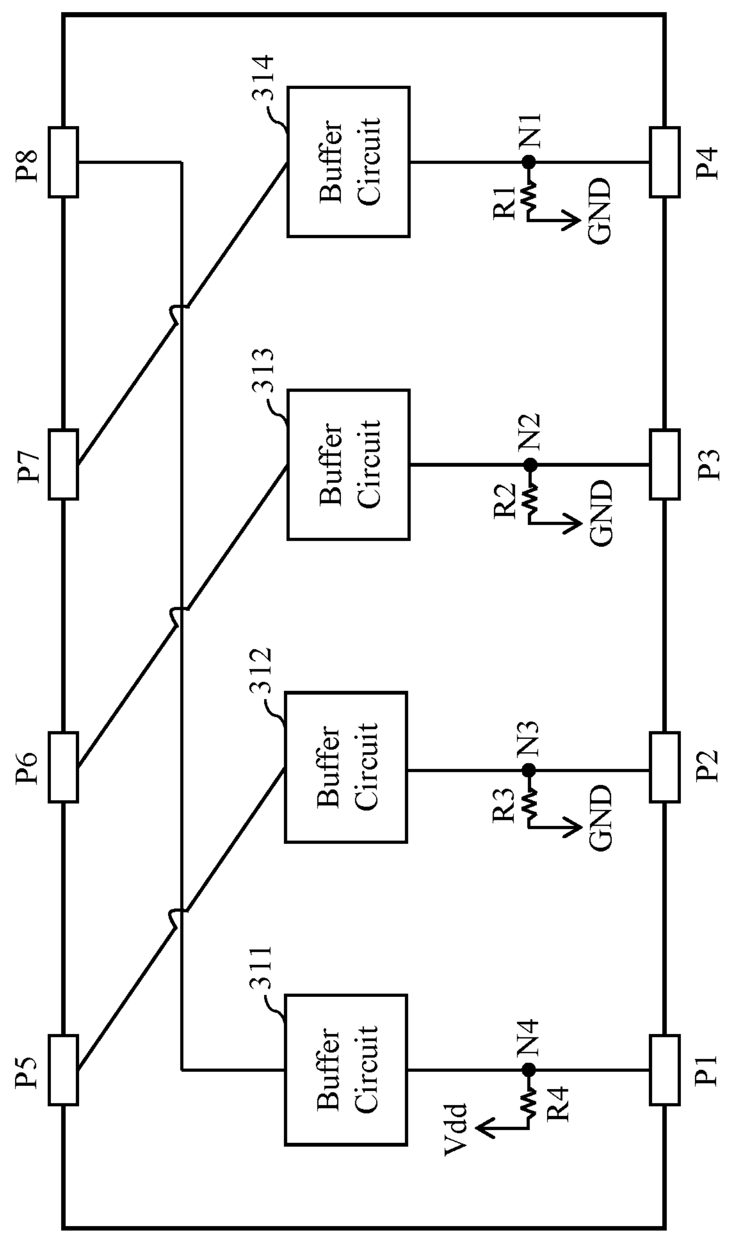
FIG. 3 is a schematic diagram of an identifier generation circuit in accordance with some embodiments of the present disclosure.

FIG. 3 is a schematic diagram of an identifier generation circuit in accordance with some embodiments of the present disclosure.

In some embodiments, each of the identifier generation circuits 214, 224, 234, and 244 shown in FIG. 2 may be implemented using the identifier generation circuit 300 shown in FIG. 3. The identifier generation circuit 300 may include input ports P1 to P4, output ports P5 to P8, and a plurality of buffer circuits 311 to 314. In some embodiments, the buffer circuit 311 may correspond to input port P1 and output port P8 of the identifier generation circuit 300. The input terminal of the buffer circuit 311 is coupled to node N4 and input port P1, and node N4 is electrically connected to a power supply voltage Vdd through a resistor R4.

It should be noted that the resistor R4 may have a large resistance, allowing the voltage at node N4 to be pulled up to the power supply voltage Vdd (e.g., logic "1") when the input port P1 is floating, allowing the output of the buffer circuit 311 to be in the high logic state (e.g., "1") at port P8. Additionally, when an input signal in either the high logic state (e.g., "1") or low logic state (e.g., "0") is provided to the input port P1, the output of the buffer circuit 311 will follow the input signal. In other words, when the input signal is in the high logic state (e.g., "1"), the output of the buffer circuit 311 is also in the high logic state (e.g., "1"). When the input signal is in the low logic state (e.g., "0"), the output of the buffer circuit 311 is also in the low logic state (e.g., "0").

In some embodiments, the buffer circuit 312 may correspond to input port P2 and output port P5 of the identifier generation circuit 300. The input terminal of the buffer circuit 312 is coupled to node N3 and input port P2, and node N3 is electrically connected to a ground voltage GND through a resistor R3.

It should be noted that the resistor R3 may have a large resistance, allowing the voltage at node N3 to be pulled down to the ground voltage Vss (e.g., logic "0") when the input port P2 is floating, allowing the output of the buffer circuit 312 to be in the low logic state (e.g., "0") at port P5. Additionally, when an input signal in either the high logic state (e.g., "1") or low logic state (e.g., "0") is provided to the input port P2, the output of the buffer circuit 312 will follow the input signal. In other words, when the input signal is in the high logic state (e.g., "1"), the output of the buffer circuit 312 is also in the high logic state (e.g., "1"). When the input signal is in the low logic state (e.g., "0"), the output of the buffer circuit 312 is also in the low logic state (e.g., "0"). The operations of the buffer circuits 313 and 314 may be similar as those of the buffer circuit 312, and thus the details will not be repeated here.

Accordingly, the operations of the identifier generation circuit 300 shown in FIG. 3 can be expressed using the truth table shown in Table 1 as follows.

TABLE 1

| | Input | | | | Output | | | | |
|---|---|---|---|---|---|---|---|---|---|
| Hex Num. | P1 | P2 | P3 | P4 | P5 | P6 | P7 | P8 | Hex. Num. |
| 8 | 1 | 0 | 0 | 0 | 0 | 0 | 0 | 1 | 1 |
| 1 | 0 | 0 | 0 | 1 | 0 | 0 | 1 | 0 | 2 |
| 2 | 0 | 0 | 1 | 0 | 0 | 1 | 0 | 0 | 4 |
| 4 | 0 | 1 | 0 | 0 | 1 | 0 | 0 | 0 | 8 |

Referring to Table 1, the chip identifier (or die identifier) of the bottom die (e.g., semiconductor die 210) within the stacked structure 200 may be 4'b0001 with a hexadecimal value of 1. Additionally, the chip identifiers of the semiconductor dies 220, 230, and 240 within the stacked structure 200 may be 4'b0010, 4'b0100, and 4'b1000 with hexadecimal values of 2, 4, and 8, respectively.

It should be noted that although the operations of left shift (e.g., circular left shift) of the identifier generation circuit 300 are shown in Table 1, in some embodiments, the identifier generation circuit 300 can also perform right shift (e.g., circular right shift) on its input signals with appropriate arrangements.

FIGS. 4A to 4D are schematic diagrams of different configurations of the buffer circuit in FIG. 3.

Figure 4B:
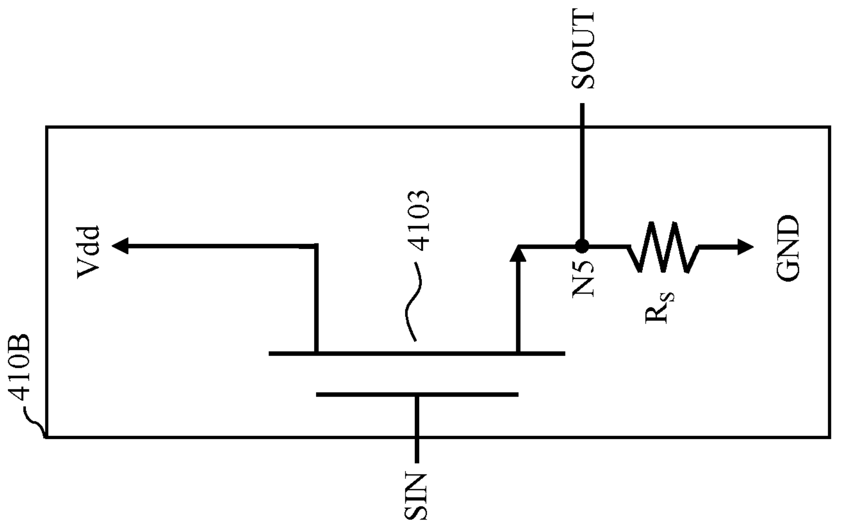
FIGS. 4A to 4D are schematic diagrams of different configurations of the buffer circuit in FIG. 3.
Figure 4A:
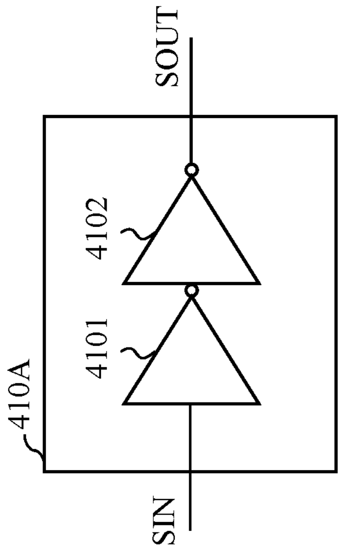

In some embodiments, each of the buffer circuits 311 to 314 to 310D in FIG. 3 can be implemented using the buffer circuit 410A shown in FIG. 4A. For example, the buffer circuit 410A may include inverters 4101 and 4102 connected in series. Accordingly, the input signal SIN may be inverted twice by the inverters 4101 and 4102, resulting in the output signal SOUT to be in the same logic state as the input signal SIN. It should be noted the buffer circuit 410A in the present disclosure is not limited to the circuit design with two inverters shown in FIG. 4A, and an inverter chain including 2N (i.e., an even number) inverters can also be used, where N is a positive integer.

FIG. 4B shows another configuration of the buffer circuit in FIG. 3. In some embodiments, each of the buffer circuits 311 to 314 in FIG. 3 can be implemented using the buffer circuit 410B shown in FIG. 4B. For example, the buffer circuit 320 may include a N-type transistor 4103 which includes a gate terminal electrically connected to the input signal SIN, a drain electrically connected to the power supply voltage Vdd, and a source electrically connected to the ground voltage GND through a resistor $R_s$. Additionally, the transistors 4103 may generate the output signal SOUT at its source (e.g., node N5). More specifically, the buffer circuit 410B may be a common drain amplifier with a voltage gain being close to unity (e.g., 1), allowing the common drain amplifier to act as a voltage buffer.

Figure 4C:
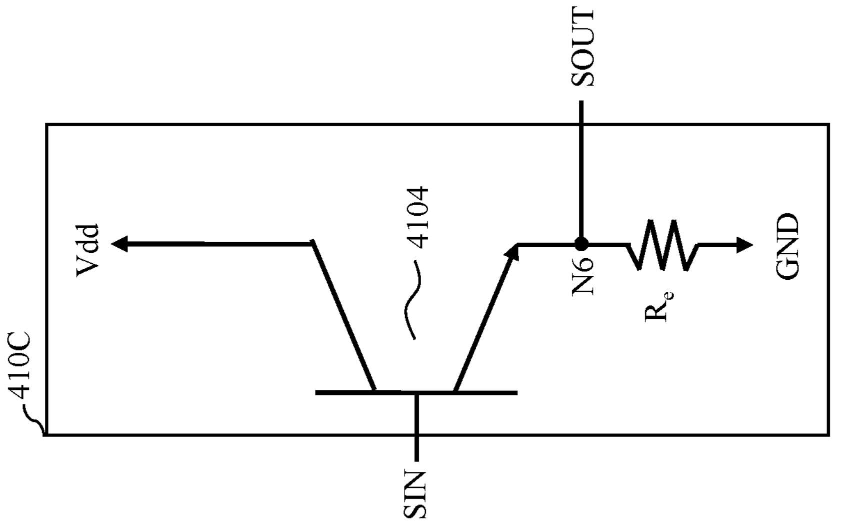

FIG. 4C shows yet another configuration of the buffer circuit in FIG. 3. In some embodiments, the N-type transistor 3201 shown in FIG. 4B can be replaced by an NPN-type bipolar junction transistor (BJT) 4104, as shown in FIG. 4C. Additionally, each of the buffer circuits 311 to 314 in FIG. 3 can be implemented using the buffer circuit 410C shown in FIG. 4C. The bipolar junction transistor 4104 includes a base terminal electrically connected to the input signal SIN, a collector terminal electrically connected to the power supply voltage Vdd, and an emitter terminal electrically connected to the ground voltage GND through a resistor $R_s$. Therefore, the BJT 4104 can be regarded as a common collector amplifier with a voltage gain being close to unity (e.g., 1), allowing the BJT 4104 to act as a voltage buffer.

Figure 4D:
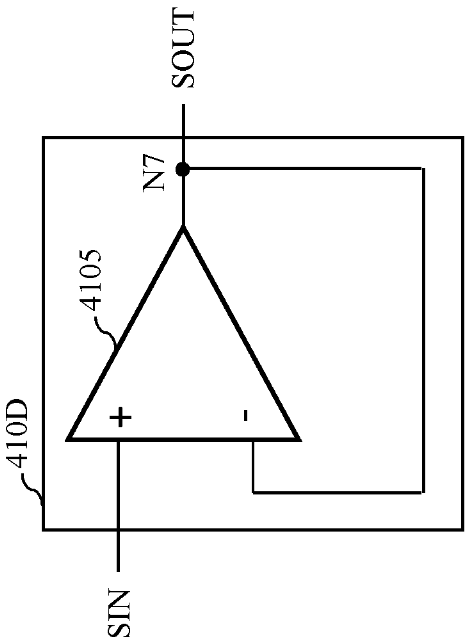

FIG. 4D shows yet another configuration of the buffer circuit in FIG. 3. In some embodiments, each of the buffer circuits 311 to 314 in FIG. 3 can be implemented using the buffer circuit 410D shown in FIG. 4D. For example, the buffer circuit 410D may include an operational amplifier 4105, which include a positive input terminal (+) electrically connected to the input signal SIN, a negative input terminal (−), and an output terminal (e.g., node N7) coupled to the negative input terminal. Additionally, the operational amplifier 4105 may have a unity gain substantially equal to 1, resulting in the output signal SOUT being equal to the input signal SIN. Therefore, the buffer circuit 410D may act as a voltage buffer.

It should be noted that the buffer circuits 410A to 410D shown in FIGS. 4A to 4D are for purposes of description, and the buffer circuits 311 to 314 shown in FIG. 3 can be implemented using any other buffer circuit (e.g., voltage buffer circuits) in addition to the buffer circuits 410A to 410D.

Figure 5:
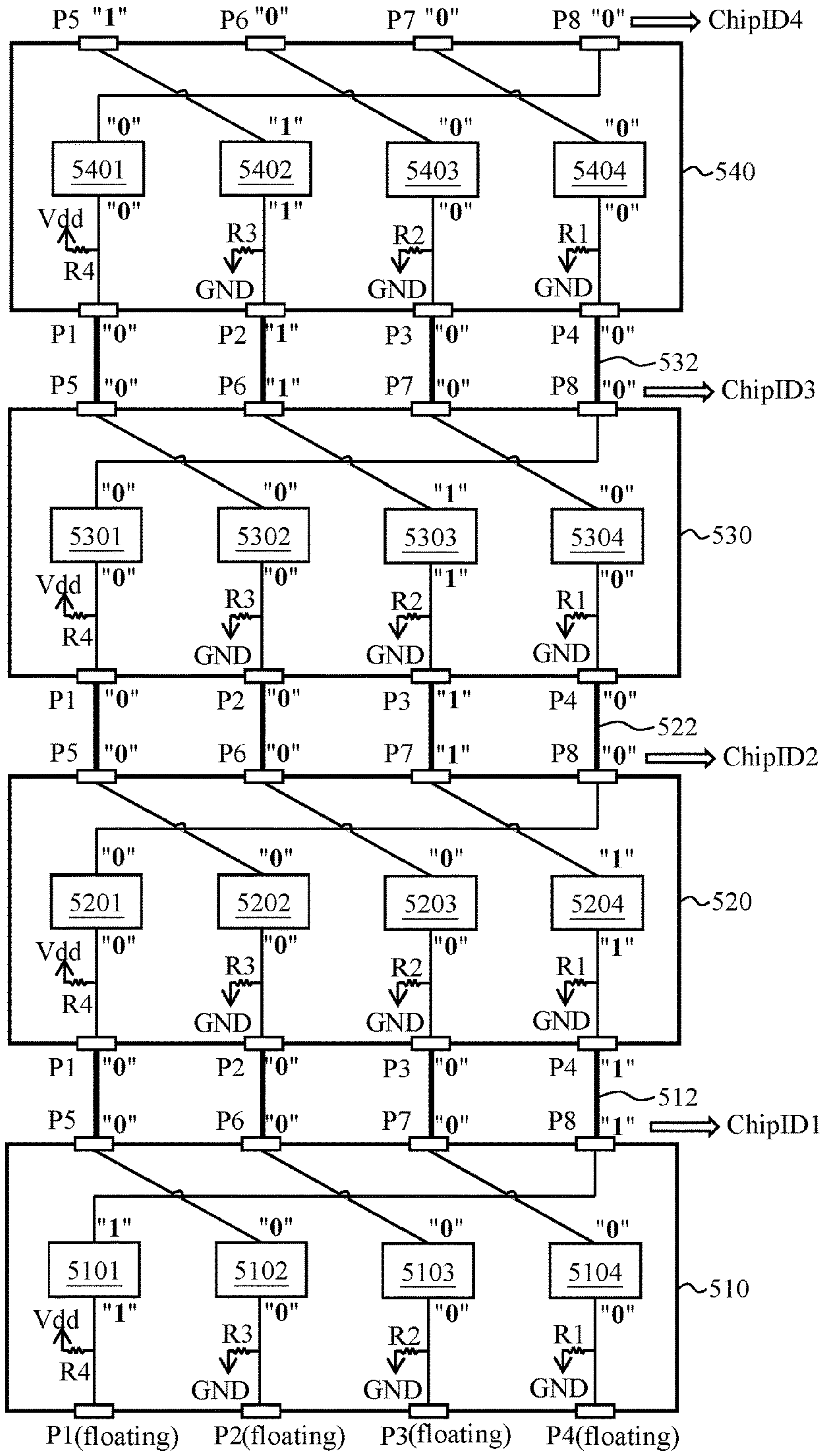
FIG. 5 is a diagram illustrating operations of a stacked structure of identifier generation circuits in accordance with some embodiments of the present disclosure.

FIG. 5 is a diagram illustrating operations of a stacked structure of identifier generation circuits in accordance with some embodiments of the present disclosure.

In some embodiments, the identifier generation circuits 510, 520, 530, and 540 within stacked structure 500 shown in FIG. 5 may correspond to the identifier generation circuits 214, 224, 234, and 244 disposed on semiconductor dies 210, 220, 230, and 240 shown in FIG. 2, respectively. In other words, the identifier generation circuits 510, 520, 530, and 540 are disposed on different semiconductor dies (not explicitly shown in FIG. 5). Additionally, the schematic diagrams of identifier generation circuit 510, 520, 530, and 540 with their input and output signals are shown in FIG. 5.

In some embodiments, the identifier generation circuit 510 may be disposed on a bottom semiconductor die among stacked structure 500, and thus the input ports P1 to P4 of the identifier generation circuit 510 remain floating (i.e., similar to the identifier generation circuit 214 in FIG. 2). At this time, when the input ports P1 to P4 are floating, the input signals of the buffer circuits 5101 to 5104 may be respectively pulled up or pulled down to "1", "0", "0", and "0" (e.g., 4'b1000 as a preset value) due to the design of a voltage pull-up circuit at port P1 and voltage pull-down circuits at the input ports P2 to P4 of the identifier generation circuit 510. The output signals of the buffer circuits 5101 to 5104 are "1", "0", "0", and "0", that are transmitted to the output ports P8, P5, P6, and P7 of the identifier generation circuit 510, respectively. Accordingly, the output signals "0", "0", "0", and "1" at the output ports P5 to P8 of the identifier generation circuit 510 will serve as the input signals at the input ports P1 to P4 of the identifier generation circuit 520.

Since the identifier generation circuit 520 is disposed on the second semiconductor die among stacked structure 500, the input ports P1 to P4 of the identifier generation circuit 520 are connected the output ports P5 to P8 of the identifier generation circuit 510 through TSVs 512, respectively. Accordingly, the input signals of the buffer circuits 5201 to 5204 of the identifier generation circuit 520 will follow the input signals "0", "0", "0", and "1" received at the input port P1 to P4 of the identifier generation circuit 520, respectively. Accordingly, the output signals of the buffer circuits 5201 to 5204 are "0", "0", "1", and "0", that are transmitted to the output ports P8, P5, P6, and P7 of the identifier generation circuit 520, respectively. Accordingly, the output signals "0", "0", "1", and "0" at the output ports P5 to P8 of the identifier generation circuit 520 will serve as the input signals at the input ports P1 to P4 of the identifier generation circuit 530.

Similarly, since the identifier generation circuit 530 disposed on the third semiconductor die among stacked structure 500, the input ports P1 to P4 of the identifier generation circuit 530 are connected the output ports P5 to P8 of the identifier generation circuit 520, respectively. Accordingly, the input signals of the buffer circuits 5301 to 5304 of the identifier generation circuit 530 will follow the input signals "0", "0", "1", and "0" received at the input port P1 to P4 of the identifier generation circuit 530, respectively. Accordingly, the output signals of the buffer circuits 5301 to 5304 are "0", "0", "1", and "0", that are transmitted to the output ports P8, P5, P6, and P7 of the identifier generation circuit 530, respectively. Accordingly, the output signals "0", "1", "0", and "0" at the output ports P5 to P8 of the identifier generation circuit 530 will serve as the input signals at the input ports P1 to P4 of the identifier generation circuit 540.

Similarly, since the identifier generation circuit 540 is disposed on the fourth semiconductor die (or topmost semiconductor die) among stacked structure 500, the input ports P1 to P4 of the identifier generation circuit 540 are connected the output ports P5 to P8 of the identifier generation circuit 530, respectively. Accordingly, the input signals of the buffer circuits 5401 to 5404 of the identifier generation circuit 540 will follow the input signals "0", "1", "0", and "0" received at the input port P1 to P4 of the identifier generation circuit 540, respectively. Accordingly, the output signals of the buffer circuits 5401 to 5404 are "0", "1", "0", and "0", that are transmitted to the output ports P8, P5, P6, and P7 of the identifier generation circuit 540, respectively. Accordingly, the identifier generation circuit 540 will generate the output signals "1", "0", "0", and "0" at its output ports P5 to P8.

It should be noted that the output signals of the identifier generation circuits 510, 520, 530, and 540 may be transmitted to the corresponding decoder circuits, such as the decoder circuits 212, 222, 232, and 242 shown in FIG. 2, allowing the logic circuitry disposed on different semiconductor dies to control the respective memory cell array (e.g., memory cell array 213, 223, 233, and 243 shown in FIG. 2) using the output signals from the identifier generation circuits 510, 520, 530, and 540.

Figure 6:
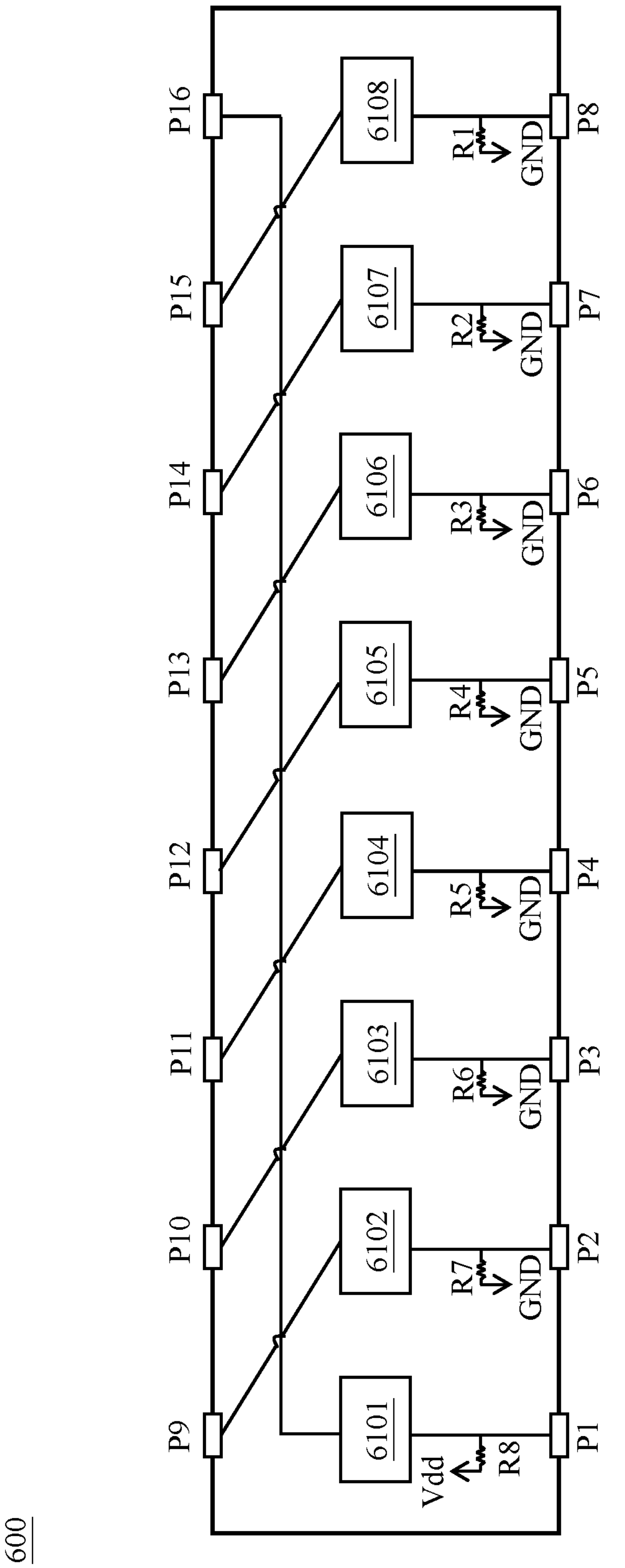
FIG. 6 is another schematic diagram of an identifier generation circuit in accordance with some embodiments of the present disclosure.

FIG. 6 is another schematic diagram of an identifier generation circuit in accordance with some embodiments of the present disclosure.

In some embodiments, the number of semiconductor dies within stacked structure 200 can be increased to 8. When the "one-hot" code is used (e.g., each semiconductor die has a unique identifier bit), the identifier generation circuit 600 shown in FIG. 6 may support 8-bit input signals and output signals. For example, the identifier generation circuit 600 may include input ports P1 to P8, output ports P9 to P16, and buffer circuits 6101 to 6108.

In some embodiments, when the identifier generation circuit 600 is disposed on a semiconductor die that is the bottom die within a stacked structure containing 8 semiconductor dies, the input ports P1 to P8 may remain floating, and the input signals of the buffer circuits 6101 to 6108 may be set to "1", "0", "0", "0", "0", "0", "0", "0" due to the design of the voltage pull-up circuit (e.g., R8 plus Vdd) and voltage pull-down circuits (e.g., R1 to R7 plus GND).

In some embodiments, when the identifier generation circuit 600 is disposed on a semiconductor die which is not the bottom semiconductor die within a stacked structure, the input ports P1 to P8 of the identifier generation circuit 600 may be electrically connected to the output ports P9 to P16 of another identifier generation circuit below it. At this time, the input signals of the buffer circuits 6101 to 6108 may be dependent on the input signals received at the input ports of the identifier generation circuit 600, and the output signals of the buffer circuits 6101 to 6108 will be transmitted to the output ports P16 and P9 to P15 of the identifier generation circuit 600, respectively.

More specifically, when the "one-hot" code is used (e.g., each semiconductor die has a unique identifier bit), the number of bits of the identifier generation circuit may be equal to the number of semiconductor dies within the stacked structure. For example, if there are 5 semiconductors dies within the stacked structure, the identifier generation circuit disposed on each semiconductor die supports 5-bit input and output signals, and so on. Additionally, each of the buffer circuits 6101 to 6108 within the identifier generation circuit 600 shown in FIG. 6 can be implemented using any one of the buffer circuits 410A to 410D shown in FIGS. 4A to 4D or other buffer circuits known or later developed in the art.

Figure 7:
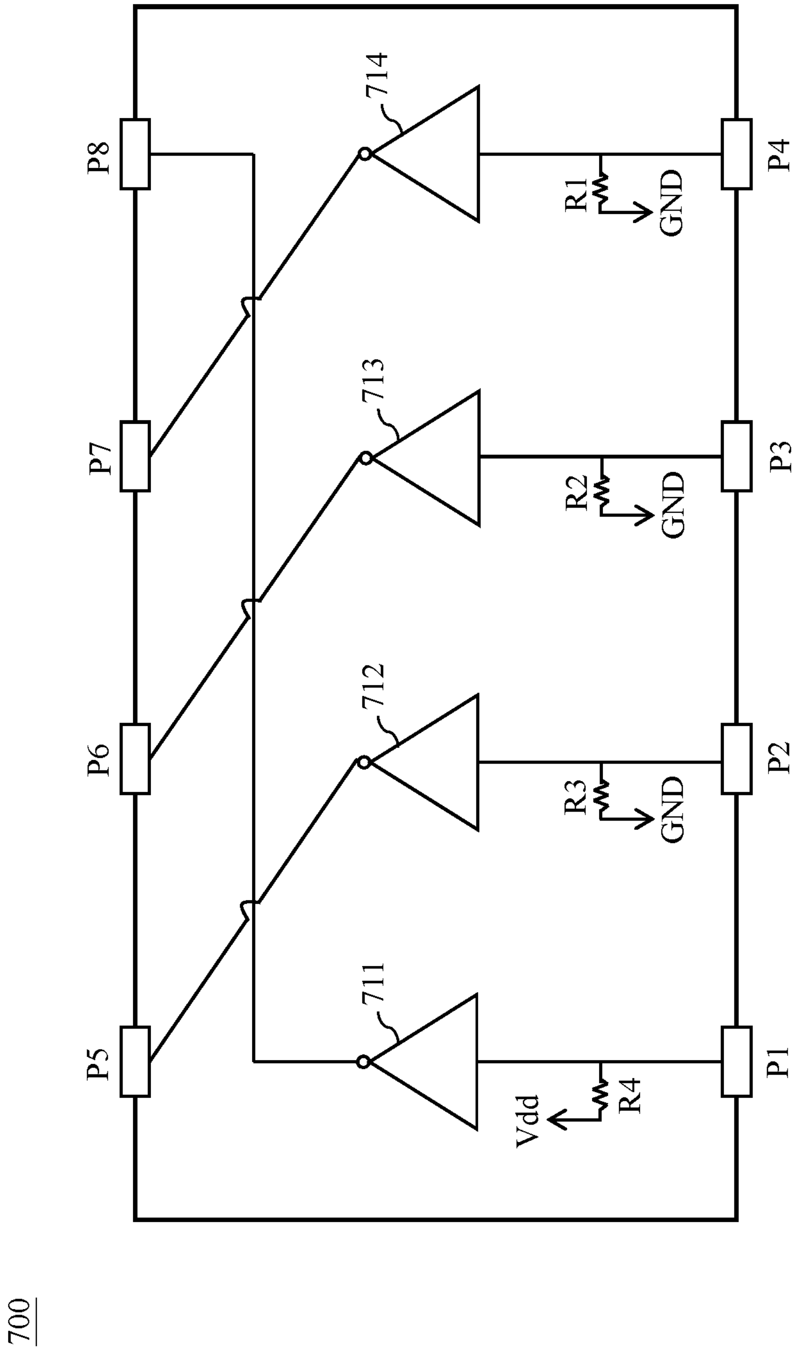
FIG. 7 is yet another schematic diagram of a buffer circuit in accordance with some embodiments of the present disclosure.

FIG. 7 is yet another schematic diagram of a buffer circuit in accordance with some embodiments of the present disclosure.

In some embodiments, each of the identifier generation circuits 214, 224, 234, and 244 shown in FIG. 2 may be implemented using the identifier generation circuit 700 shown in FIG. 7. Additionally, the chip identifier or die identifier for each semiconductor die within the stacked structure can be expressed using another code different from the one-hot code. For purposes of description, when the stacked structure includes 4 semiconductor dies, the identifier generation circuit 700 supports 4-bit input and output signals. The identifier generation circuit 700 shown in FIG. 7 may be similar to identifier generation circuit 300 shown in FIG. 3, with the difference being that each buffer circuit within the identifier generation circuit 700 may be implemented using an inverter, such as inverters 711 to 714.

It should be noted that the resistor R4 may have a large resistance, allowing the voltage at node N4 to be pulled up to the power supply voltage Vdd (e.g., logic "1") when the input port P1 is floating, allowing the output of the inverter 711 to be in the low logic state (e.g., "0") at port P8. Additionally, when an input signal in either the high logic state (e.g., "1") or low logic state (e.g., "0") is provided to the input port P1, the output signal of the inverter 711 will be the complementary signal of the input signal. In other words, when the input signal is in the high logic state (e.g., "1"), the output signal generated by the inverter 711 is in the low logic state (e.g., "0"). When the input signal is in the low logic state (e.g., "0"), the output of the inverter 711 is in the high logic state (e.g., "1").

Accordingly, the operations of the identifier generation circuit 700 can be expressed using the truth table shown in Table 2 as follows.

TABLE 2

| | Input | | | | Output | | | | |
|---|---|---|---|---|---|---|---|---|---|
| Hex Num. | P1 | P2 | P3 | P4 | P5 | P6 | P7 | P8 | Hex. Num. |
| 8 | 1 | 0 | 0 | 0 | 1 | 1 | 1 | 0 | E |
| E | 1 | 1 | 1 | 0 | 0 | 0 | 1 | 0 | 2 |
| 2 | 0 | 0 | 1 | 0 | 1 | 0 | 1 | 1 | B |
| B | 1 | 0 | 1 | 1 | 1 | 0 | 0 | 0 | 8 |

Referring to Table 2, the chip identifier (or die identifier) of the bottom die (e.g., semiconductor die 210) within the stacked structure 200 may be 4'b1110 with a hexadecimal value of E. Additionally, the chip identifiers of the semiconductor dies 220, 230, and 240 within the stacked structure 200 may be 4'b0010, 4'b1011, and 4'b1000 with hexadecimal values of 2, B, and 8, respectively. More specifically, the output signal generated by inverters (buffer circuits) 711 to 714 is bitwise complementary to the input signal received by inverters 711 to 714.

It should be noted that although each buffer circuit illustrated in FIG. 7 includes a single inverter (e.g., inverters 711 to 714), each buffer circuit can include an inverter chain having an odd number of inverters.

It should also be noted that although the operations of left shift (e.g., circular left shift) of the identifier generation circuit 700 are shown in Table 1, in some embodiments, identifier generation circuit 700 can also perform right shift (e.g., circular right shift) on its input signals with appropriate arrangements.

Figure 8:
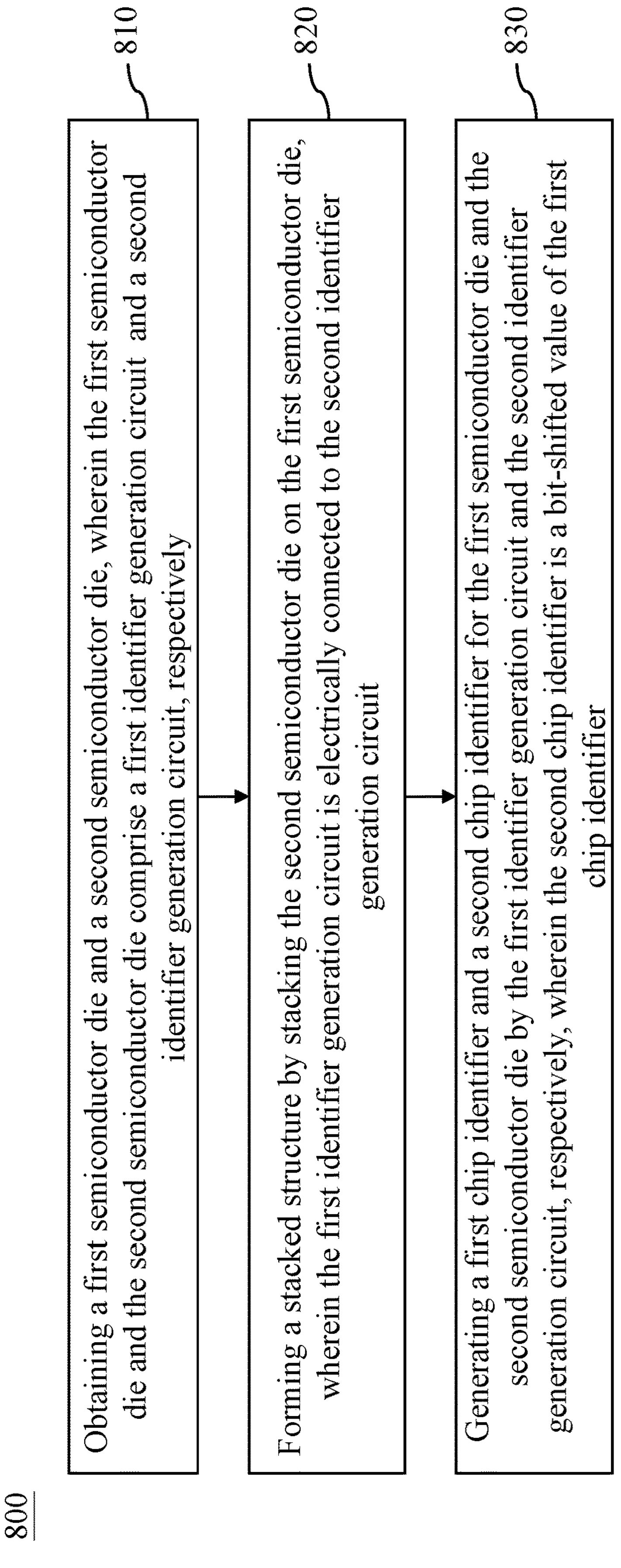
FIG. 8 is a flowchart of a method for automatically generating chip identifiers for semiconductor dies within a stacked structure in accordance with some embodiments of the present disclosure.

FIG. 8 is a flowchart of a method for automatically generating chip identifiers for semiconductor dies within a stacked structure in accordance with some embodiments of the present disclosure. Please refer to FIG. 2, FIG. 5, and FIG. 8.

In step 810, a first semiconductor die (e.g., semiconductor die 210) and a second semiconductor die (e.g., semiconductor die 220) are obtained, wherein the first semiconductor die and the second semiconductor die comprise a first identifier generation circuit (e.g., identifier generation circuit 214) and a second identifier generation circuit (e.g., identifier generation circuit 224), respectively.

In step 820, a stacked structure is formed by stacking the second semiconductor die on the first semiconductor die, wherein the first identifier generation circuit is electrically connected to the second identifier generation circuit.

In step 830, a first chip identifier and a second chip identifier for the first semiconductor die and the second semiconductor die are generated by the first identifier generation circuit and the second identifier generation circuit, respectively, wherein the second chip identifier is a bit-shifted value of the first chip identifier.

In an aspect of the present disclosure, a semiconductor device is provided, which includes a plurality of semiconductor dies arranged in a stacked structure. Each semiconductor die includes an identifier generation circuit electrically connected to the identifier generation circuits of other semiconductor dies. In response to a first semiconductor die not being a bottom semiconductor die within the stacked structure, a first identifier generation circuit of the first semiconductor die is configured to automatically generate a first chip identifier for the first semiconductor die based on an input signal generated by a second identifier generation circuit of a second semiconductor die neighboring to and below the first semiconductor die.

In some embodiments, the stacked structure is a three-dimensional stacked structure.

In some embodiments, in response to the second semiconductor die being the bottom semiconductor die within the stacked structure, the second identifier generation circuit of the second semiconductor die is configured to automatically generate a second chip identifier for the second semiconductor die using a preset value.

In some embodiments, the input signal of the first identifier generation circuit of the first semiconductor die is the second chip identifier generated by the second identifier generation circuit.

In some embodiments, the first chip identifier generated by the first identifier generation circuit is a bit-shifted value of the second chip identifier.

In some embodiments, the first chip identifier and the second chip identifier are different one-hot codes.

In some embodiments, the first identifier generation circuit includes a plurality of first buffer circuits, a plurality of first input ports, and a plurality of first output ports. The first buffer circuits correspond to the first input ports and the first output ports. Each first buffer circuit receives a corresponding bit of the second chip identifier from the corresponding first input port.

In some embodiments, a first output signal generated by the first buffer circuits is equal to the second chip identifier, and the first identifier generation circuit is further configured to left-shift the first output signal by 1 bit to generate the first chip identifier at the first output ports. Alternatively, the first identifier generation circuit is further configured to right-shift the first output signal by 1 bit to generate the first chip identifier at the first output ports.

In some embodiments, each first buffer circuit includes an inverter chain with an even number of inverters, a common drain amplifier, or a common collector amplifier.

In some embodiments, a first output signal generated by the first buffer circuits is bitwise complementary to the second chip identifier, and the first identifier generation circuit is further configured to left-shift the first output signal by 1 bit to generate the first chip identifier at the first output ports. Alternatively, the first identifier generation circuit is further configured to right-shift the first output signal by 1 bit to generate the first chip identifier at the first output ports.

In some embodiments, each first buffer circuit comprises an inverter chain with an odd number of inverters.

In some embodiments, the second identifier generation circuit includes a plurality of second buffer circuits, a plurality of second input ports, and a plurality of second output ports, and the second buffer circuits correspond to the second input ports and the second output ports. In response to the second semiconductor die being the bottom semiconductor die within the stacked structure, a plurality of second input ports of the second identifier generation circuit of the second semiconductor die are floating.

In some embodiments, a first input terminal of the second buffer circuit with respect to the second input port for a most significant bit is pulled up to a power supply voltage through a first resistor.

In some embodiments, a second input terminal of each second buffer circuit with respect to the second input ports for non-most significant bit is pulled down to a ground voltage through a respective second resistor.

In some embodiments, a second output signal generated by the second buffer circuits is equal to the preset value, and the second identifier generation circuit is further configured to left-shift the second output signal by 1 bit to generate the second chip identifier at the second output ports.

In some embodiments, a second output signal generated by the second buffer circuits is bitwise complementary to the preset value, and the second identifier generation circuit is further configured to left-shift the second output signal by 1 bit to generate the second chip identifier at the second output ports.

In some embodiments, the first identifier generation circuit is electrically connected to the second identifier generation circuit through a plurality of through-silicon vias within the second semiconductor die.

In another aspect of the present disclosure, a method for automatically generating chip identifier for semiconductor dies in a stacked structure is provided, which includes the following steps: obtaining a first semiconductor die and a second semiconductor die, wherein the first semiconductor die and the second semiconductor die comprise a first identifier generation circuit and a second identifier generation circuit, respectively; forming a stacked structure by stacking the second semiconductor die on the first semiconductor die, wherein the first identifier generation circuit is electrically connected to the second identifier generation circuit; and generating a first chip identifier and a second chip identifier for the first semiconductor die and the second semiconductor die by the first identifier generation circuit and the second identifier generation circuit, respectively, wherein the second chip identifier is a bit-shifted value of the first chip identifier.

In some embodiments, the method further includes the following step: electrically connecting the first identifier generation circuit to the second identifier generation circuit through a plurality of through-silicon vias within the first semiconductor die.

In some embodiments, the method further includes the following step: generating the first chip identifier using a preset value in response to the first semiconductor die being a bottom die within the stacked structure.

In some embodiments, a most significant bit of the preset value is 1, and each bit other than the most significant bit of the preset value is 0.

In some embodiments, the method further includes the following step: left-shifting the preset value to generate the first chip identifier for the first semiconductor die.

In some embodiments, the method further includes the following step: utilizing the first identifier generation circuit and the second identifier generation circuit to transmit the first chip identifier and the second chip identifier to a first decoder circuit and a second decoder circuit disposed on the first semiconductor die and the second semiconductor die, respectively.

In yet another aspect of the present disclosure, a memory device is provided, which includes a stacked structure having a first memory die and a second memory die. The first memory die is stacked on the second memory die. The first memory die and the second memory die include a first identifier generation circuit and a second identifier generation circuit, respectively. The second identifier generation circuit is configured to automatically generate a second chip identifier for the second memory die using a preset value. The first identifier generation circuit is configured to automatically generate a first chip identifier using the second chip identifier.

In some embodiments, the first identifier generation circuit is electrically connected to the second identifier generation circuit through a plurality of through-silicon vias within the second memory die.

In some embodiments, a plurality of input ports of the second identifier generation circuit are floating.

In some embodiments, the first chip identifier generated by the first identifier generation circuit is a bit-shifted value of the second chip identifier.

In some embodiments, the first chip identifier and the second chip identifier are different one-hot codes.

In some embodiments, the first chip identifier generated by the first identifier generation circuit is a bit-shifted bitwise complementary value of the second chip identifier.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, or steps.

What is claimed is:

1. A semiconductor device, comprising:

a plurality of semiconductor dies, arranged in a stacked structure, wherein each semiconductor die comprises an identifier generation circuit electrically connected to the identifier generation circuits of other semiconductor dies, wherein in response to a first semiconductor die not being a bottom semiconductor die within the stacked structure, a first identifier generation circuit of the first semiconductor die is configured to automatically generate a first chip identifier for the first semiconductor die based on an input signal generated by a second identifier generation circuit of a second semiconductor die neighboring to and below the first semiconductor die;

wherein in response to the second semiconductor die being the bottom semiconductor die within the stacked structure, the second identifier generation circuit of the second semiconductor die is configured to automatically generate a second chip identifier for the second semiconductor die using a preset value;

wherein the input signal of the first identifier generation circuit of the first semiconductor die is the second chip identifier generated by the second identifier generation circuit;

wherein the second identifier generation circuit comprises a plurality of second buffer circuits, a plurality of second input ports, and a plurality of second output ports, and the second buffer circuits correspond to the second input ports and the second output ports, wherein in response to the second semiconductor die being the bottom semiconductor die within the stacked structure, the plurality of second input ports of the second identifier generation circuit of the second semiconductor die are floating.

2. The semiconductor device of claim 1, wherein the stacked structure is a three-dimensional stacked structure.

3. The semiconductor device of claim 1, wherein the first chip identifier generated by the first identifier generation circuit is a bit-shifted value of the second chip identifier.

4. The semiconductor device of claim 1, wherein the first chip identifier and the second chip identifier are different one-hot codes.

5. The semiconductor device of claim 3, wherein the first identifier generation circuit comprises a plurality of first buffer circuits, a plurality of first input ports, and a plurality of first output ports, and the first buffer circuits correspond to the first input ports and the first output ports, wherein each first buffer circuit receives a corresponding bit of the second chip identifier from the corresponding first input port.

6. The semiconductor device of claim 5, wherein a first output signal generated by the first buffer circuits is equal to the second chip identifier, and the first identifier generation circuit is further configured to left-shift the first output signal by 1 bit to generate the first chip identifier at the first output ports.

7. The semiconductor device of claim 6, wherein each first buffer circuit comprises an inverter chain with an even number of inverters, a common drain amplifier, or a common collector amplifier.

8. The semiconductor device of claim 5, wherein a first output signal generated by the first buffer circuits is equal to the second chip identifier, and the first identifier generation circuit is further configured to right-shift the first output signal by 1 bit to generate the first chip identifier at the first output ports.

9. The semiconductor device of claim 5, wherein a first output signal generated by the first buffer circuits is bitwise complementary to the second chip identifier, and the first identifier generation circuit is further configured to left-shift the first output signal by 1 bit to generate the first chip identifier at the first output ports.

10. The semiconductor device of claim 9, wherein each first buffer circuit comprises an inverter chain with an odd number of inverters.

11. The semiconductor device of claim 5, wherein a first output signal generated by the first buffer circuits is bitwise complementary to the second chip identifier, and the first identifier generation circuit is further configured to right-shift the first output signal by 1 bit to generate the first chip identifier at the first output ports.

12. The semiconductor device of claim 1, wherein a first input terminal of the second buffer circuit with respect to the second input port for a most significant bit is pulled up to a power supply voltage through a first resistor.

13. The semiconductor device of claim 12, wherein a second input terminal of each second buffer circuit with respect to the second input ports for non-most significant bit is pulled down to a ground voltage through a respective second resistor.

14. The semiconductor device of claim 13, wherein a second output signal generated by the second buffer circuits is equal to the preset value, and the second identifier generation circuit is further configured to left-shift the second output signal by 1 bit to generate the second chip identifier at the second output ports.

15. The semiconductor device of claim 13, wherein a second output signal generated by the second buffer circuits is bitwise complementary to the preset value, and the second identifier generation circuit is further configured to left-shift the second output signal by 1 bit to generate the second chip identifier at the second output ports.

16. The semiconductor device of claim 1, wherein the first identifier generation circuit is electrically connected to the second identifier generation circuit through a plurality of through-silicon vias within the second semiconductor die.

* * * * *